United States Patent [19]

Berg, deceased et al.

[11] 3,899,232

[45] Aug. 12, 1975

[54] CIRCUIT BOARD SOCKET

[75] Inventors: Quentin Berg, deceased, late of New Cumberland, Pa.; by Francis H. Berg, co-executor; Dauphin Deposit Trust Co., co-executor, both of New Cumberland, Pa.

[73] Assignee: E. I. du Pont de Nemours & Company, Wilmington, Del.

[22] Filed: Feb. 4, 1974

[21] Appl. No.: 439,622

[52] U.S. Cl. ............ 339/17 C; 339/119; 339/258 A

[51] Int. Cl. ......................... H01r 11/22; H05k 1/02

[58] Field of Search ........ 339/258 R, 258 A, 258 P, 339/258 RR, 254 R, 254 M, 256 R, 256 T, 176 MP, 16 R, 17 R, 17 C, 258 A, 94 R, 114

[56] References Cited

UNITED STATES PATENTS

| | | | |
|---|---|---|---|
| 3,368,188 | 2/1968 | Olsson | 339/258 A X |
| 3,383,648 | 5/1968 | Tems | 339/258 A |
| 3,681,738 | 8/1972 | Friend | 339/256 R X |
| 3,796,988 | 3/1974 | Palombella | 339/258 R |

*Primary Examiner*—Roy Lake
*Assistant Examiner*—E. F. Desmond
*Attorney, Agent, or Firm*—Thomas Hooker, Esq.

[57] ABSTRACT

A cylindrical circuit board socket with a metal body open at each end having a pair of lead contact fingers extending from one end into the interior of the socket for forming an electrical connection with a lead inserted into the socket and a pair of circuit board contact fingers extending from the other end along the outside of the body for holding the socket in a circuit board hole prior to soldering the socket to printed circuitry at the hole. A seal at each end of the body closes the interior of the body and prevents flux and solder from flowing into the interior of the socket during fluxing and soldering of the socket. A contact lead is easily inserted into the socket through a seal to form an electrical connection with the interior fingers.

8 Claims, 6 Drawing Figures

CIRCUIT BOARD SOCKET

This invention relates to circuit board sockets of the type shown in U.S. Pat. Nos. 2,969,517; 3,222,632; 3,634,879; 3,681,738; and 3,686,525, which are positioned in holes in the thickness of circuit boards and soldered therein, usually by a wave soldering process. These circuit board sockets each include a spring contact in the interior of the socket body which is not soldered and makes electrical connection with a lead inserted into the body after the soldering step. During the soldering process, the lower surface of the circuit board carrying the sockets is usually first moved through a wave of flux. The flux flows into the openings in the circuit board hole between the socket and the hole to assure that the adjacent metal parts are fluxed for the subsequent soldering operation. In open ended circuit board sockets, there is a likelihood that the flux will flow over the upper lip of the socket and into the interior of the socket body so that it coats the spring contacts located therein. Such a flux coating is deleterious to the electrical connection between the lead and the contacts and, in time, may corrode the contact area. The problem of flux entering into the interior of the socket body is particularly severe in applications where the lead-receiving end of the circuit board socket is flush with or only slightly above the top side of the board away from the flux wave. Conventionally, the lower end of the socket is closed to prevent flux from being forced into the interior contact area.

After flux has been applied to the circuit board, the board is moved across a molten solder wave so that each circuit board hole with a socket therein is soldered and molten solder flows up the fluxed space between the socket and the hole to form a soldered connection therebetween. In many applications, the circuit board hole is plated and the space between the hole and the socket is completely filled with solder. During the wave soldering operation, there is a probability that the solder would flow through the open lead-receiving end of conventional sockets to the contact area, thus rendering the socket unuseable for forming an electrical connection with a lead. In conventional circuit board sockets difficulty has been experienced in preventing flux and solder from entering the interior contact area of the socket.

The present circuit board socket includes a hollow cylindrical metal body open at both ends with a pair of opposed fingers extending from each body end. A pair of lead contact fingers extend from one end of the body into the interior of the body for engaging a lead inserted into the body through the end. A pair of circuit board contact fingers extend from the other end of the body along diametrically opposite exterior sides of the body and serves to hold the body in place in a circuit board hole prior to soldering.

A penetrable seal is provided at both ends of the body, extends around lengths of the fingers at such ends, and forms a positive flux and solder barrier. A lead may be inserted through the seal to enter the body and to form an electrical connection with the lead contact fingers within the body. The use of the seal at both ends of the socket eliminates the need for a drawn or stamp-formed body with a closed metal end, thus reducing manufacturing problems and expense. Also, because the seal positively closes the lead-receiving end of the socket, this end may be mounted very close to the top of the circuit board to provide a desirable space-saving low profile. The major portion of the circuit board socket is confined within the thickness of the board and the socket extends to either side of the board only to a very small extent. The ends of the circuit board contact fingers adjacent the body form lead-ins, having a separation less than the diameter of the body, and thereby facilitate insertion of the socket into the circuit board hole. The free ends of these fingers point away from the direction of insertion and cannot hang up on the circuit board hole during insertion. Injury to the plating and the socket is reduced. This is an important feature since the plating in circuit board holes is relatively delicate, particularly in the case of multilayer boards where the plating in the holes forms electrical connections with circuit planes within the board.

Other objects and features of the invention will become apparent as the description proceeds, especially when taken in conjunction with the accompanying drawings illustrating the invention, of which there is one sheet.

IN THE DRAWINGS

Figure 6:
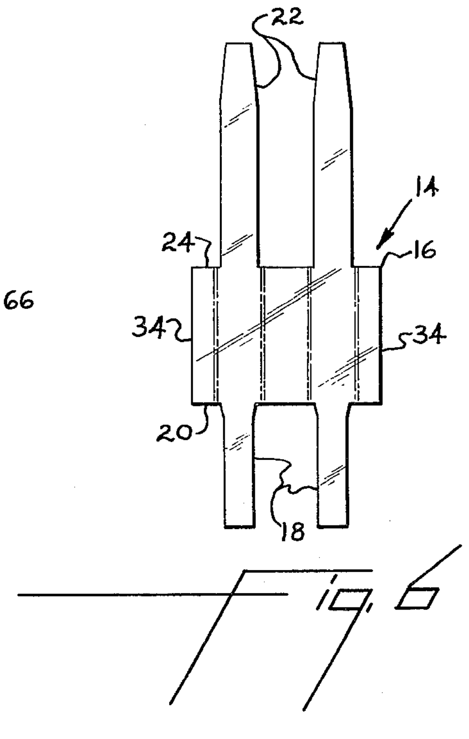
FIG. 6 is a plan view of a metal preform used in forming the circuit board socket of this invention.

Circuit board socket 10 includes a metal body 12 made from a preform 14, illustrated in FIG. 6. The preform 14 is preferably stamped from flat, thin sheet metal stock and includes a generally rectangular body portion 16 having a first pair of fingers 18 extending from edge 20 of the body portion and a longer pair of contact fingers 22 extending from the opposite parallel edge 24 of the body portion. The fingers extend at right angles from the edges. Each finger 18 is directly opposite a finger 20 across the body so that the two fingers extend along a common axis with the body portion 16 located between them. The fingers of each pair are equally spaced from the center of its respective edge 20 or 24. The preform 14 is preferably stamped from flat, thin and solder adherent sheet metal stock and includes a rectangular central portion 16 having opposed and generally parallel edges 18 and 20.

The body 12 of socket 10 is formed from a flat preform 14 by a metal bending operation such that the body portion 16 is bent at right angles along lines 30 indicated in FIG. 6 to form an elongate hollow generally cylindrical body 32 with preform body portion edges 34 abutting each other at longitudinal seam 36.

Figure 1:
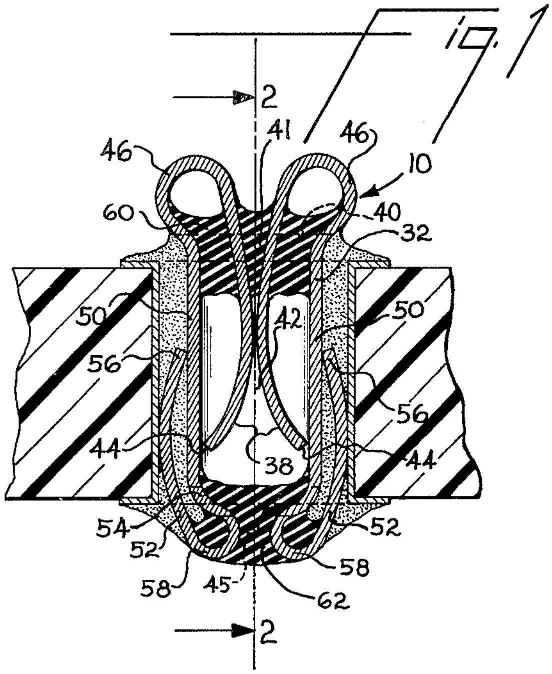
FIG. 1 is a sectional view illustrating a circuit board socket according to this invention soldered in a plated hole extending through a circuit board.
Figure 2:
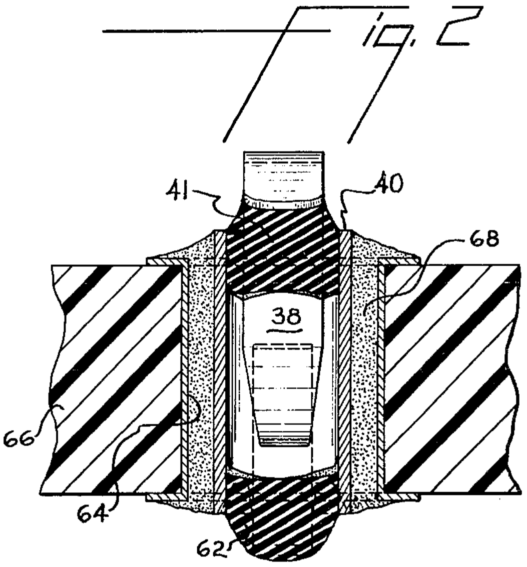
FIG. 2 is a sectional view taken along line 2—2 of FIG. 1.
Figures 3, 4:
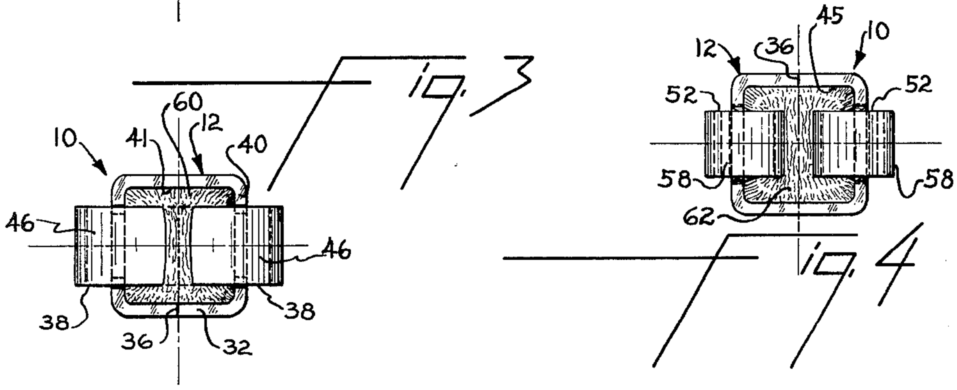
FIGS. 3 and 4 are top and bottom views, respectively, of the circuit board socket of FIGS. 1 and 2.
Figure 5:
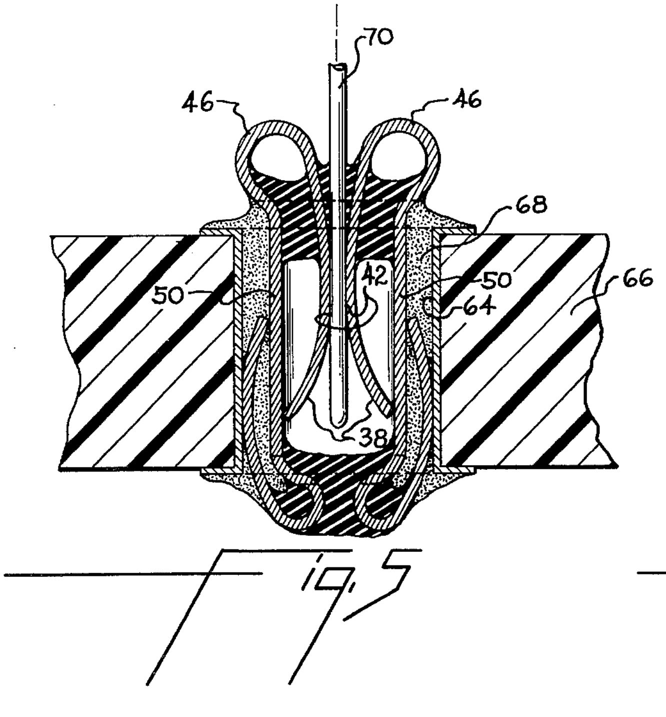
FIG. 5 is a view similar to that of FIG. 1 illustrating a lead inserted into the socket.

Preform fingers 22 are bent to form a pair of leadreceiving spring fingers 38 as illustrated in FIGS. 1 and 5. Each spring finger extends from the upper end 40 of body 32, outwardly of the body and is smoothly bent around an angle greater than 180° so that the end of the spring finger extends into the interior of body 32 through the opening 41 at end 40. The portions of the spring fingers 38 within the body 32 extennd generally along the longitudinal axis of the body and are bowed toward each other to form contacts 40 for a lead inserted into the body through the opening 41. The free ends 44 of the spring fingers are located closely adjacent the interior walls of body 32 so that upon insertion of a lead the ends engage the walls, therefore reinforcing the spring and adding to the contact pressure at point 42. The spring fingers 38 are bent outwardly of the body and then around and into the body to form resilient hollow spring curls 46, thereby adding to the spring properties of the fingers. The curls extend inwardly of body sides 50 so as to provide a lead-in for leads inserted into the circuit board socket 10.

The shorter fingers 18 of preform 14 are bent to form outwardly directed circuit board-engaging spring fingers 52 as illustrated in FIGS. 1 and 5. Each finger 52 extends from end 54 of body 32, is bent inwardly toward the axis of the body and then around a reverse bend of greater than 180° so that the end of the finger extends back along the outer surface of a side 50. The ends of fingers 52 are bowed outwardly of the sides 50 with the free ends 56 positioned adjacent the sides 50. The reverse bend of fingers 52 is gradual to define hollow spring curls 58 contributing to the spring properties of fingers 52. The curls 58 are relatively closely spaced to either side of the longitudinal axis of the body.

Following formation of body 12 from preform 14, flux and solder seals 60 and 62 are formed at body ends 40 and 54 to close openings 41 and 45 respectively. A small portion of flowable sealing material is applied to the ends of the body 12. The sealing material flows into the openings 41 and 45 at each end and around the spring fingers 38 and 52 to completely seal the openings. After the sealing material is flowed into place, it hardens or sets to form permanent seals.

The seals 60 and 62 are preferably formed by applying room temperature vulcanizing silicone rubber to the body 12. As illustrated in FIGS. 1 and 5, the seal 62 flows around and within curls 58 so that, upon vulcanizing or setting, it is firmly held in place at end 54. The seal 60 likewise flows around the spring fingers 38 and partially into the interior space defined by curls 46 and is similarly held in place. The rubber material applied at body end 54 does not flow between the side walls 50 and the ends of exterior spring fingers 52 so that these ends are free to flex.

Circuit board socket 10 is mounted in a hole 64 extending through the thickness of a circuit board 66. Hole 64 is preferably plated and surrounded at each end with plated contact pads. The board 66 may include one or more internal plated layers joining the plating in the hole. During insertion of the socket, the outwardly bowed spring fingers 58 engage the plating, are compressed somewhat, and when the socket is inserted to the proper depth, hold the socket in place in the hole until the soldering operation is completed. The resiliency of fingers 52 permits insertion of sockets 10 into circuit board holes having diameters somewhat greater or smaller than the diameter of the hole illustrated in the drawings. The curls 58, which extend inwardly of sides 50, form lead-ins for the circuit board sockets 10 to facilitate aligning the relatively small sockets with the holes 68 prior to insertion of the sockets into the holes.

With the socket held in position in a circuit board hole by the exterior spring fingers 52, the circuit board is then fluxed by applying liquid fluxing material to the lower surface of the board so that the flux flows into the circuit board hole and coats the exposed plating and outer surfaces of the socket 10. The plugs 60 and 62 prevent the flux from flowing into the interior of the socket to the contacts 42, thereby protecting the contacts against being fluxed.

After fluxing, the lower surface of the circuit board is exposed to a molten solder wave so that the molten solder is drawn up into the circuit board hole 64 and forms a soldered joint 68 electrically connecting the socket 10 to the printed circuitry. The seals 60 and 62 prevent the molten solder from flowing into the interior of body 32.

FIG. 5 illustrates a circuit board socket 10 soldered to the circuit board with a lead 70 inserted through the opening 41 at end 40 to form an electrical connection with the inner spring fingers 38. The lead punctures the plug 60 as it is moved through the opening and into the body. Upon withdrawal of the lead, the resilient plug closes to maintain the seal at end 40. In this way, the contact space within the body of the socket remains sealed against dust, corrosive gases, and other materials which could adversely effect the contact properties of the socket.

While the socket as disclosed shows a pair of plugs 60 and 62, one at each end of the socket, it is contemplated that the socket body 12 may be completely filled with a sealing compound such as the room temperature vulcanizing silicone rubber. In some applications, a seal may be provided only at the end of the socket which is exposed to the soldering operation. The body 12, without seals, may be used in certain applications as desired, particularly where it is hand soldered to a circuit board.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. A circuit board socket comprising an elongate hollow metal body open at each end thereof; a pair of diametrally opposed circuit board contact fingers each extending from one end of the body inwardly toward the axis of the body around a reverse bend of greater than 180° and then along the outer surface of the body, said contact fingers being outwardly bowed of said surface for retaining the circuit board socket in a circuit board hole; a pair of diametrally opposed lead contact fingers each extending from the other end of the body outwardly of the body around a reverse bend of greater than 180° through the opening at said other end of the body and into the interior of the body, such contact fingers being inwardly bowed toward each other within the body to define contact areas closely spaced for forming an electrical connection with a lead inserted into the body through an end of the body and between such spring fingers.

2. A circuit board socket as in claim 1, including sealing means for closing the openings at each end of the body, such means extending around said fingers.

3. A circuit board socket as in claim 2 wherein said sealing means comprises a silicone rubber seal at each end of the body.

4. A circuit board socket comprising an elongate hollow metal body; a pair of lead contact fingers each extending from one end of said body outwardly of the body around a reverse bend and into the interior of the body, such fingers including closely spaced contact surfaces for forming an electrical connection with a lead inserted into the body and between the fingers; a pair of circuit board contact fingers each extending from one end of said body inwardly toward the axis of the body around a reverse bend and along the outer surface of the body, the portion of such fingers extending along the outer surface of the body outwardly bowed for retaining the circuit board socket in a circuit board hole.

5. A circuit board socket as in claim 4, including resilient sealing means for closing at least one end of said body.

6. A circuit board socket comprising an elongate hollow open ended metal body; a first pair of opposed spring fingers extending from one end of the body along the outer surface of the body; each spring finger including a portion outwardly bowed of said surface for retaining the socket in a circuit board hole; a second pair of opposed spring fingers extending from the other end of the body; such fingers being inwardly bowed toward each other within the body to define closely spaced contacts for forming an electrical connection with a lead inserted through an end of the body and between said second fingers.

7. A circuit board socket comprising an elongate generally cylindrical hollow metal body open at both ends; at least a pair of lead contact fingers extending into the body from one end thereof for forming an electrical connection with the lead inserted into the interior of the body through one end of the body; means for mounting the body in a circuit board hole; and penetrable sealing means completely closing each end of the body to prevent flux or molten solder from flowing into the interior of the body.

8. A circuit board socket as in claim 7 wherein said means surrounds portions of said fingers at said one end of the body.

* * * * *